United States Patent
Kim et al.

(10) Patent No.: US 9,972,693 B2
(45) Date of Patent: May 15, 2018

(54) DISPLAY DEVICE

(71) Applicant: Samsung Display Co., Ltd., Yongin-si, Gyeonggi-do (KR)

(72) Inventors: Deukjong Kim, Yongin-si (KR); Mikyung Kim, Yongin-si (KR); Keunsoo Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/080,381

(22) Filed: Mar. 24, 2016

(65) Prior Publication Data
US 2016/0365398 A1    Dec. 15, 2016

(30) Foreign Application Priority Data

Jun. 12, 2015  (KR) .................. 10-2015-0083664

(51) Int. Cl.
*H01L 27/32*    (2006.01)
*H01L 29/45*    (2006.01)
*H01L 51/52*    (2006.01)

(52) U.S. Cl.
CPC .......... *H01L 29/45* (2013.01); *H01L 27/3258* (2013.01); *H01L 27/3276* (2013.01); *H01L 27/3297* (2013.01); *H01L 51/5253* (2013.01)

(58) Field of Classification Search
CPC ............. H01L 27/3258; H01L 27/3244; H01L 27/3246; H01L 27/3297; H01L 27/3276
See application file for complete search history.

(56) References Cited

U.S. PATENT DOCUMENTS

| | | | |
|---|---|---|---|
| 2008/0179595 A1* | 7/2008 | Song | ................ G02F 1/134363 257/59 |
| 2009/0153042 A1 | 6/2009 | Izumi et al. | |
| 2011/0198572 A1 | 8/2011 | Park et al. | |
| 2014/0145171 A1* | 5/2014 | Park | .................... H01L 27/3276 257/40 |
| 2014/0176399 A1* | 6/2014 | Lee | ......................... G09G 3/20 345/55 |

(Continued)

FOREIGN PATENT DOCUMENTS

| KR | 20-2008-0003962 U | 9/2008 |
|---|---|---|
| KR | 10-2009-0064320 A | 6/2009 |

(Continued)

*Primary Examiner* — Michele Fan
(74) *Attorney, Agent, or Firm* — Knobbe Martens Olson & Bear LLP

(57) ABSTRACT

A display device is disclosed. In one aspect, the device includes a substrate and a display unit disposed on the substrate and including a plurality of pixels each pixel including a thin film transistor, a display element electrically connected to the thin film transistor, and a planarization layer interposed between the thin film transistor and the display element. The display unit includes a display region and a non-display region surrounding the display region, wherein the non-display region includes a voltage line. The planarization layer comprises a central portion, an outer portion and a dividing region interposed between the central and outer portions, wherein the dividing region is located in the non-display region. The planarization layer covers at least a lateral side of the voltage line formed in the dividing region.

13 Claims, 5 Drawing Sheets

(56) References Cited

U.S. PATENT DOCUMENTS

2014/0184964 A1* 7/2014 Byeon ............... G02F 1/134363
349/33
2014/0332769 A1* 11/2014 Lee ..................... H01L 27/3272
257/40

FOREIGN PATENT DOCUMENTS

KR  10-2011-0093510 A   8/2011
KR  10-2014-0133053 A   11/2014

* cited by examiner

DISPLAY DEVICE

CROSS-REFERENCE TO RELATED APPLICATION

This application claims the benefit of Korean Patent Application No. 10-2015-0083664, filed on Jun. 12, 2015, in the Korean Intellectual Property Office, the disclosure of which is incorporated herein in its entirety by reference.

BACKGROUND

Field

The described technology generally relates to a display device.

Description of the Related Technology

Recently, the trend in display devices is the use of plate-type flat panel displays. Among flat panel displays, self-luminous electroluminescent technology has favorable characteristics such as wide viewing angles, high contrast, and high refresh rate, and are thus considered to be the preferred choice for next-generation display devices. An organic light-emitting diode (OLED) display has a light-emitting layer formed of an organic material and high brightness, improved driving-voltage, and a multi-color display capability.

SUMMARY OF CERTAIN INVENTIVE ASPECTS

One inventive aspect relates to a display device.

Another aspect is a display device that includes: a substrate; and a display unit disposed on the substrate, the display unit including a thin film transistor, a display element electrically connected to the thin film transistor, and a planarization layer disposed between the thin film transistor and the display element, wherein the display unit includes a display region and a non-display region that is around the display region, and a voltage line is arranged in the non-display region, wherein the planarization layer includes a dividing region by which the planarization layer is divided into a central part and an outer part, and the dividing region is located in the non-display region that is around the display region, wherein the voltage line is partially exposed in the dividing region, and the planarization layer covers at least a lateral side of the voltage line exposed in the dividing region.

The voltage line may include: a first voltage line disposed at a position corresponding to a side of the display region; and a pair of connection parts protruding from the first voltage line in a first direction across the dividing region, wherein lateral sides of the pair of first connection parts exposed in the dividing region may be covered with first covering parts extending from the central part and second covering parts extending from the outer part, and the first covering parts and the second covering parts may be separate from each other.

Each of the first connection parts may include: a first region extending from the first voltage line in the first direction; and a second region continuously extending from the first region in the first direction, wherein the second region may be shifted from the first region in a direction perpendicular to the first direction.

The first covering parts may extend from the central part in the first direction and may cover lateral sides of the first regions, and the second covering parts may extend from the outer part in a direction opposite the first direction and may cover lateral sides of the second regions.

The voltage line may further include a second voltage line covering a pair of first end portions of the first voltage line and remaining regions of the display region, and the central part may be in contact with inner edge portions of the second voltage line in an overlapping manner.

The second voltage line may include: a pair of bent parts covering the pair of first end portions; and a pair of second connection parts respectively protruding from the pair of bent parts in the first direction across the dividing region, wherein the second covering parts may cover lateral sides of the pair of second connection parts exposed in the dividing region.

The pair of second connection parts may be respectively spaced apart from end portions of the pair of bent parts, and the first covering parts may cover lateral sides which are formed on the end portions of the pair of bent parts in the first direction.

The display device may further include a dam making contact with outer edge portions of the second voltage line in an overlapping manner, wherein the dam may be located in the dividing region.

The dam may be formed in the same layer as the planarization layer by using the same material as that used to form the planarization layer.

The display device may further include a thin film encapsulating layer sealing the display unit, wherein the thin film encapsulating layer may include at least one organic layer and at least one inorganic layer, and the at least one organic layer may be located inside the dam.

The at least one inorganic layer may extend to a region outside the outer part.

The thin film transistor may include an active layer, a gate electrode, a source electrode, and a drain electrode, and each of the source electrode, the drain electrode, and the voltage line may have a triple-layer structure of titanium, aluminum, and titanium.

A gate insulating layer may be disposed between the active layer and the gate electrode, and an interlayer insulating layer may be disposed between the gate electrode and the source and drain electrodes, wherein the gate insulating layer and the interlayer insulating layer may extend even in the non-display region, and the at least one inorganic layer may be in contact with the gate insulating layer or the interlayer insulating layer in the region outside the outer part.

The at least one inorganic layer may pass by an end portion of the gate insulating layer or the interlayer insulating layer and may make contact with an upper surface of the substrate.

The display element may be an organic light-emitting device including a first electrode electrically connected to the thin film transistor, a second electrode opposite the first electrode, and an intermediate layer disposed between the first and second electrodes.

Another aspect is a display device, comprising: a substrate; and a display unit disposed on the substrate and including a plurality of pixels each pixel comprising a thin film transistor, a display element electrically connected to the thin film transistor, and a planarization layer interposed between the thin film transistor and the display element, wherein the display unit comprises a display region and a non-display region surrounding the display region, wherein the non-display region includes a voltage line, wherein the planarization layer comprises a central portion, an outer portion and a dividing region interposed between the central and outer portions, wherein the dividing region is located in the non-display region, and wherein the planarization layer covers at least a lateral side of the voltage line formed in the dividing region.

In the above display device, the voltage line comprises: a first voltage line disposed at a position corresponding to a side of the display region; and a pair of connectors protruding from the first voltage line in a first direction, wherein lateral sides of the first connectors are covered by a pair of first covering portions extending from the central portion and a pair of second covering portions extending from the outer portion, and wherein the first and second covering portions are separated apart from each other. In the above display device, each of the first connectors comprises: a first region extending from the first voltage line in the first direction; and a second region continuously extending from the first region in the first direction, wherein the first and second regions are not aligned in a second direction crossing the first direction.

In the above display device, the first covering portions extend from the central portion in the first direction and cover lateral sides of the first regions, and wherein the second covering portions extend from the outer portion in a third direction opposite the first direction and cover lateral sides of the second regions. In the above display device, the voltage line further comprises a second voltage line covering a pair of first end portions of the first voltage line and a remaining region of the display region other than the side of the display region, and wherein the central portion contacts and overlaps an inner edge portion of the second voltage line in the depth dimension of the display device.

In the above display device, the second voltage line comprises: a pair of bent portions covering the first end portions; and a pair of second connectors respectively protruding from the bent portions in the first direction, wherein the second covering portions cover lateral sides of the second connectors. In the above display device, the second connectors are respectively spaced apart from end portions of the bent portions, and wherein the first covering portions cover lateral sides formed on the end portions of the bent portions.

The above display device further comprises a dam contacting and overlapping outer edge portions of the second voltage line in the depth dimension of the display device, wherein the dam is located in the dividing region and does not contact the central portion. In the display device, the dam is formed on the same layer as the planarization layer and formed of the same material as that of the planarization layer. The above display device further comprises a thin film encapsulating layer sealing the display unit, wherein the thin film encapsulating layer comprises at least one organic layer and at least one inorganic layer, and wherein the at least one organic layer is located inside the dam.

In the above display device, the at least one inorganic layer extends to a region outside the outer portion. In the above display device, the thin film transistor comprises an active layer, a gate electrode, a source electrode, and a drain electrode, and wherein each of the source electrode, the drain electrode, and the voltage line has a triple-layer structure formed of titanium, aluminum, and titanium. The above display device further comprises: a gate insulating layer interposed between the active layer and the gate electrode; and an interlayer insulating layer interposed between the gate and source electrodes and between the gate and drain electrodes, wherein the gate insulating layer and the interlayer insulating layer extend into the non-display region, and wherein the at least one inorganic layer contacts the gate insulating layer or the interlayer insulating layer in the region outside the outer portion.

In the above display device, the at least one inorganic layer is formed over an end portion of the gate insulating layer or the interlayer insulating layer and contacts an upper surface of the substrate. In the above display device, the display element includes an organic light-emitting diode comprising a first electrode electrically connected to the thin film transistor, a second electrode opposite the first electrode, and an intermediate layer interposed between the first and second electrodes.

Another aspect is a display device, comprising: a substrate including a display region and a non-display region surrounding the display region; a planarization layer formed over the display area and a portion of the non-display area; and a voltage line formed in the non-display region of the substrate, wherein the planarization layer comprises a first portion formed in the display and non-display regions and a second portion formed only in the non-display region, and wherein the voltage line and at least a portion of the planarization layer are formed on the same layer.

The above display device further comprises a thin film encapsulation layer including at least one organic layer and at least one inorganic layer alternately formed with respect to each other over the first portion of the planarization layer. In the above display device, the at least one inorganic layer comprises a plurality of inorganic layers contacting each other at least over the second portion of the planarization layer. In the above display device, the planarization layer further includes a dam formed in the non-display region and interposed between the first and second regions of the planarization layer, and wherein the organic layers do not overlap the dam in the depth dimension of the display device. In the above display device, the voltage line includes first and second voltage lines, wherein the second voltage line extends in a first direction, wherein the first voltage line extends in a second direction crossing the first direction, and wherein the second voltage line is formed in the non-display region.

According to at least one of the disclosed embodiments, the display device is configured to prevent the permeation of moisture or oxygen into display elements, thereby minimizing defects such as dark points.

DETAILED DESCRIPTION OF CERTAIN INVENTIVE EMBODIMENTS

Figure 1:
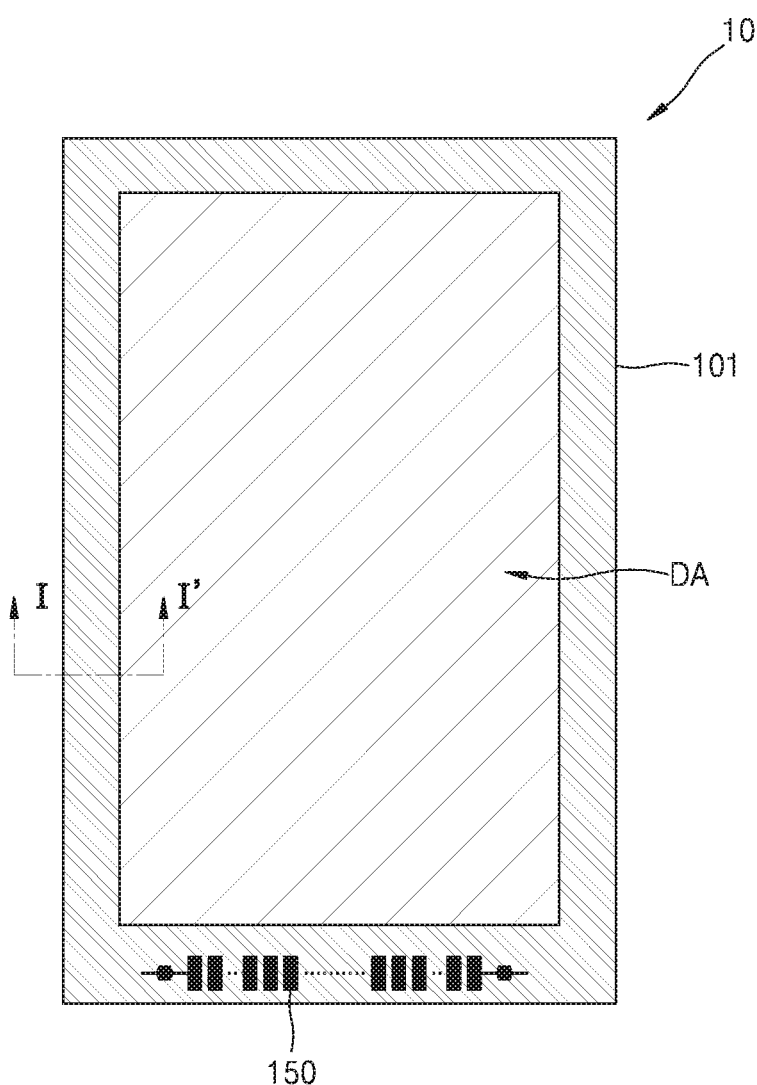
FIG. 1 is a schematic plan view illustrating a display device according to an exemplary embodiment.

Reference will now be made in detail to embodiments, examples of which are illustrated in the accompanying drawings. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Moreover, detailed descriptions related to well-known functions or configurations will be ruled out in order not to unnecessarily obscure subject matters of the present disclosure.

It will be understood that although the terms "first," "second," etc. may be used herein to describe various components, these components should not be limited by these terms. These terms are only used to distinguish one component from another.

In the following description, the technical terms are used only for explaining a specific exemplary embodiment while not limiting the inventive concept. As used herein, the singular forms "a," "an" and "the" are intended to include the plural forms as well, unless the context clearly indicates otherwise. Sizes of elements in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is referred to as being disposed or formed "on" or "under" another layer, region, or component, it can be directly or indirectly disposed or formed on the other layer, region, or component. That is, for example, intervening layers, regions, or components may be present. In addition, the word "on" or "above" is selected based on the drawings.

Hereinafter, the exemplary embodiments will be described with reference to the accompanying drawings. In the drawings, like reference numerals denote like elements, and overlapping descriptions thereof will be omitted. In this disclosure, the term "substantially" includes the meanings of completely, almost completely or to any significant degree under some applications and in accordance with those skilled in the art. The term "connected" can include an electrical connection.

Figure 2:
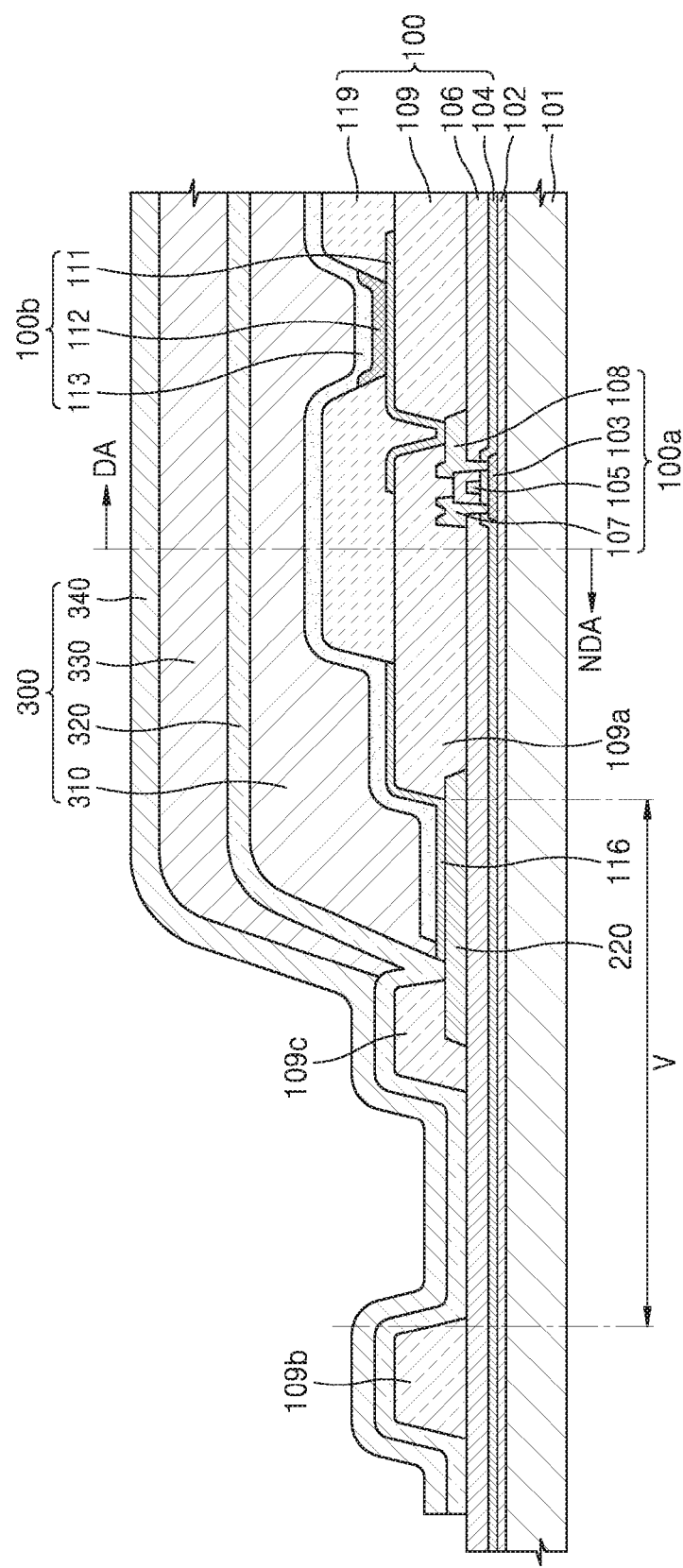
FIG. 2 is a schematic cross-sectional view taken along line I-I' of FIG. 1.
Figure 3:
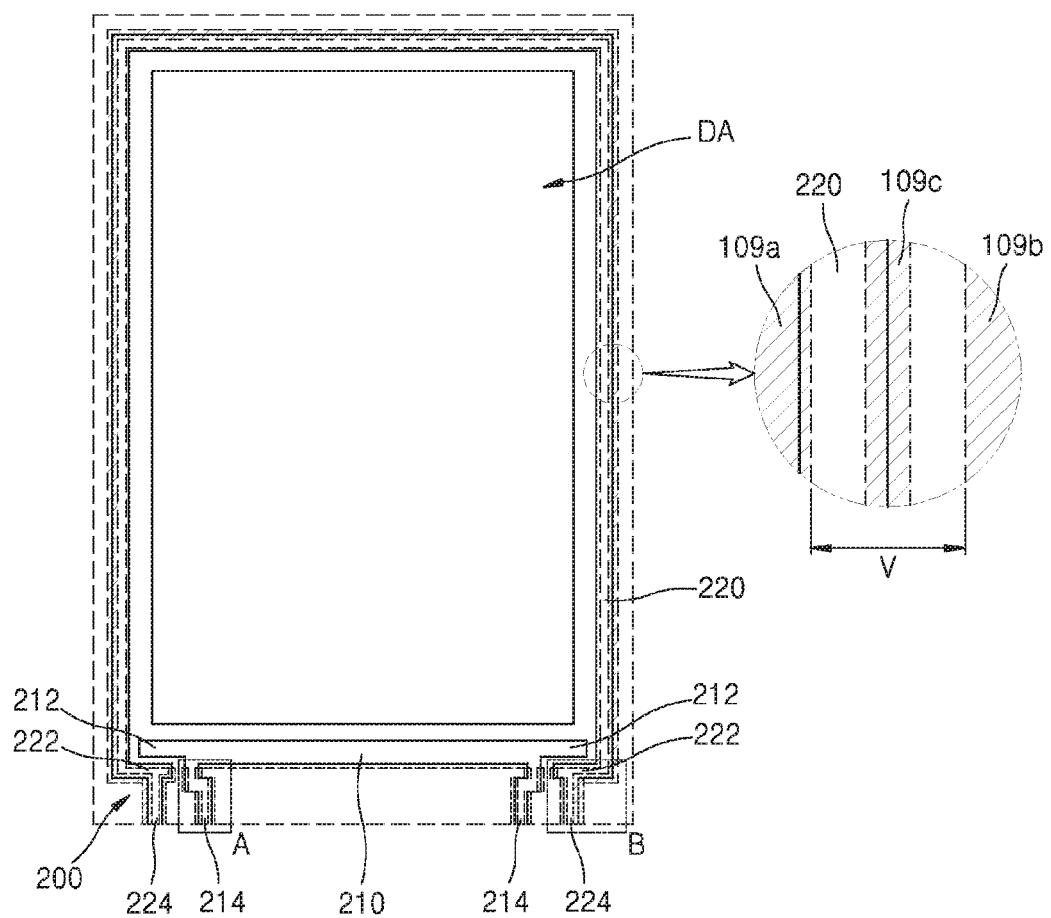
FIG. 3 is a schematic plan view illustrating a voltage line and a planarization layer of the display device illustrated in FIG. 1.
Figure 4:
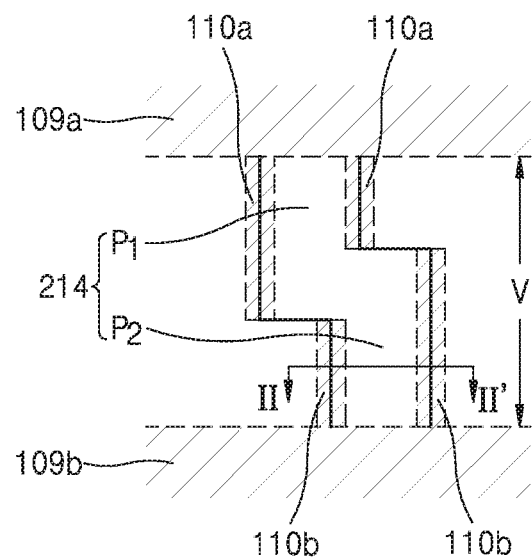
FIG. 4 is an enlarged view schematically illustrating a region A of FIG. 3.
Figure 5:
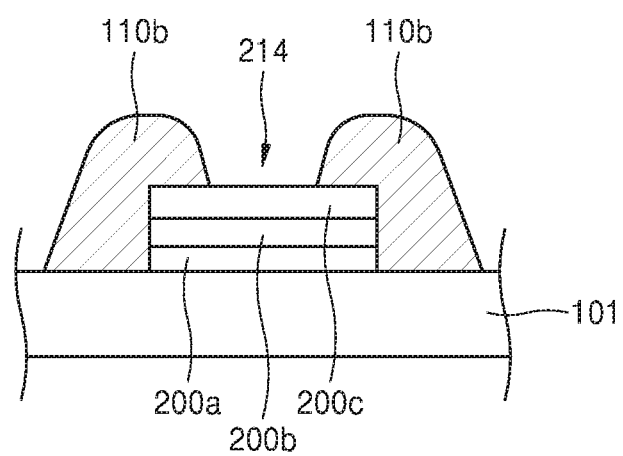
FIG. 5 is a schematic cross-sectional view taken along line II-II' of FIG. 4.
Figure 6:
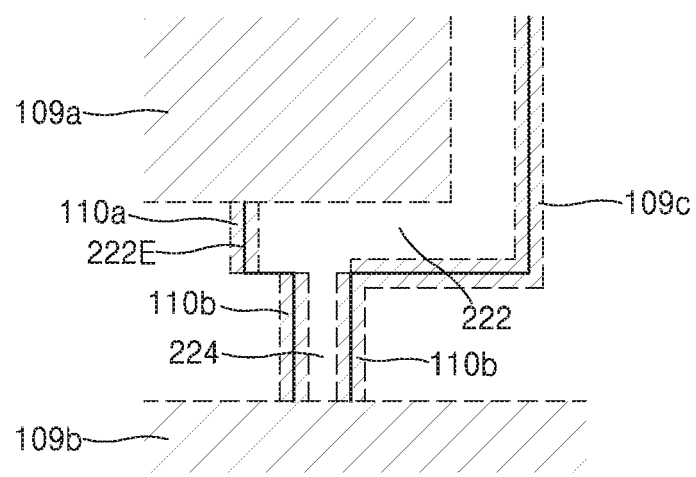
FIG. 6 is an enlarged view schematically illustrating a region B of FIG. 3.

FIG. 1 is a schematic plan view illustrating a display device 10 according to an exemplary embodiment. FIG. 2 is a schematic cross-sectional view taken along line I-I' of FIG. 1. FIG. 3 is a schematic plan view illustrating a voltage line 200 and a planarization layer 109 (refer to FIG. 2) of the display device 10 illustrated in FIG. 1. FIG. 4 is an enlarged view schematically illustrating a region A of FIG. 3. FIG. 5 is a schematic cross-sectional view taken along line II-II' of FIG. 4. FIG. 6 is an enlarged view schematically illustrating a region B of FIG. 3.

Referring to FIGS. 1 to 6, the display device 10 of the exemplary embodiment includes a substrate 101, a display unit 100 disposed on the substrate 101, and a thin film encapsulating layer 300 sealing the display unit 100.

The substrate 101 may be formed of one or more materials. For example, the substrate 101 is formed of a transparent glass material including $SiO_2$ as a main component. However, the substrate 101 is not limited thereto. In another example, the substrate 101 is formed of a transparent plastic material. Examples of the plastic material include polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

If the display device 10 is a bottom emission-type display device configured to emit light through the substrate 101 for displaying images, the substrate 101 may include a transparent material. However, if the display device 10 is a top emission-type display device configured to emit light in a direction opposite the substrate 101 for displaying images, the substrate 101 does not include a transparent material. In this case, the substrate 101 may include a metallic material. Examples of the metallic material that may be used to form the substrate 101 includes iron, chromium, manganese, nickel, titanium, molybdenum, stainless steel (SUS), Invar, Inconel, and Kovar.

The display unit 100 is disposed on the substrate 101. The display unit 100 may include a display region DA in which user-perceptible images are formed and a non-display region NDA that is around the display region DA.

Display elements 100b may be arranged in the display region DA. For example, the display elements 100b are organic light-emitting diodes (OLEDs). The voltage line 200 may be arranged in the non-display region NDA for supplying power to elements such as the display elements 100b. A pad unit 150 may be disposed in the non-display region NDA for transmitting electric signals from a power supply (not shown) or a signal generator to the display region DA.

Hereinafter, the display unit 100 will be described with reference to FIG. 2.

A buffer layer 102 may be disposed on the substrate 101. The buffer layer 102 may be disposed in the display region DA and may extend even in the non-display region NDA.

The buffer layer 102 may form a flat surface on an upper side of the substrate 101 and may block the ingress of foreign substances or moisture through the substrate 101. For example, the buffer layer 102 includes an inorganic material such as silicon oxide, silicon nitride, silicon oxynitride, aluminum oxide, aluminum nitride, titanium oxide, or titanium nitride, or an organic material such as polyimide, polyester, or acrylic. The buffer layer 102 may have a stacked structure including two or more of the listed materials.

Thin film transistors 100a and the display elements 100b electrically connected to the thin film transistors 100a may be arranged above the substrate 101.

Each of the thin film transistors 100a may include an active layer 103, a gate electrode 105, a source electrode 107, and a drain electrode 108. The following description will be presented under the assumption that each of the thin film transistors 100a is a top gate-type transistor in which the active layer 103, the gate electrode 105, the source electrode 107, and the drain electrode 108 are sequentially formed. However, the described technology is not limited thereto, and the thin film transistors 100a may be other types of transistors such as bottom gate-type transistors.

The active layer 103 may be formed of a semiconductor material such as amorphous silicon or polycrystalline silicon. However, the described technology is not limited thereto, and the active layer 103 may include another material. In some exemplary embodiments, the active layer 103 includes an organic semiconductor material.

In other exemplary embodiments, the active layer 103 includes an oxide semiconductor material. For example, the active layer 103 includes an oxide of a material selected from Group 12, 13, and 14 metal elements such as zinc (Zn), indium (In), gallium (Ga), tin (Sn), cadmium (Cd), and germanium (Ge), and combinations thereof.

A gate insulating layer 104 is disposed on the active layer 103. The gate insulating layer 104 may have a monolayer or multi-layer structure including one or more inorganic materials such as silicon oxide and/or silicon nitride. The gate insulating layer 104 insulates the active layer 103 and the gate electrode 105 from each other. The gate insulating layer 104 may be formed in a portion of the non-display region NDA as well as in the display region DA.

The gate electrode 105 is disposed on the gate insulating layer 104. The gate electrode 105 may be connected to a gate line (not shown) through which an on/off signal is applied to the thin film transistors 100a.

The gate electrode 105 may include a metallic material having low resistance. For example, the gate electrode 105 has a monolayer or multi-layer structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating layer 106 is disposed on the gate electrode 105. The interlayer insulating layer 106 insulates the source electrode 107 and the drain electrode 108 from the gate electrode 105. The interlayer insulating layer 106 may be formed in a portion of the non-display region NDA as well as in the display region DA.

The interlayer insulating layer 106 may have a monolayer or multi-layer structure including one or more inorganic materials. For example, the inorganic materials include a metal oxide or a metal nitride. Examples of the inorganic materials include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zirconium oxide ($ZrO_2$).

The source electrode 107 and the drain electrode 108 are disposed on the interlayer insulating layer 106. The source electrode 107 and the drain electrode 108 are in contact with regions of the active layer 103.

Each of the source electrode 107 and the drain electrode 108 may have a monolayer or multi-layer structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, each of the source electrode 107 and the drain electrode 108 may have a triple-layer structure of titanium (Ti), aluminum (Al), and titanium (Ti).

The planarization layer 109 covers the thin film transistors 100a. The planarization layer 109 prevents height differences caused by the thin film transistors 100a and forms a flat upper surface. In addition, the planarization layer 109 prevents defects of the display elements 100b, caused by a lower uneven surface.

The planarization layer 109 may have a monolayer or multi-layer structure including one or more organic materials. Examples of the organic materials include general-purpose polymers such as polymethylmethacrylate (PMMA) or polystyrene (PS), polymer derivatives having phenolic groups; acrylic polymers, imidic polymers, aryletheric polymers, amidic polymers, fluoric polymers, p-xylenic polymers, vinyl alcoholic polymers, and blends thereof. Alternatively, the planarization layer 109 may have a multi-layer structure formed by an inorganic insulating layer and an organic insulating layer.

The planarization layer 109 may include a dividing region V formed in the non-display region NDA around the display region DA. The dividing region V may be formed by partially removing the planarization layer 109 so as to prevent the permeation of moisture into the display region DA through the planarization layer 109 formed of organic matter. The dividing region V may divide the planarization layer 109 into a central part 109a and an outer part 109b, and the area of the central part 109a may be larger than the area of the display region DA.

The display elements 100b are disposed on the planarization layer 109. For example, each of the display elements 100b is an OLED including a first electrode 111, a second electrode 113 opposite the first electrode 111, and an intermediate layer 112 disposed between the first and second electrodes 111 and 113.

The first electrode 111 may be disposed on the planarization layer 109 and may be electrically connected to the thin film transistor 100a through a contact hole formed in the planarization layer 109. The first electrode 111 may have a shape such as an island shape formed through a patterning process.

For example, the first electrode 111 is a reflective electrode. For example, the first electrode 111 includes a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or translucent electrode layer disposed on the reflective layer. The transparent or translucent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The second electrode 113 may be a transparent or translucent electrode including a thin metal film including lithium (Li), calcium (Ca), LiF/Ca, LiF/Al, aluminum (Al), silver (Ag), magnesium (Mg), or a compound thereof which has a low work function. In addition, an auxiliary electrode layer or a bus electrode may be formed on the thin metal film by using a transparent electrode-forming material such as ITO, IZO, ZnO, or $In_2O_3$. Therefore, the second electrode 113 may transmit light emitted from an organic emission layer included in the intermediate layer 112. Light emitted from the organic emission layer may be incident on the second electrode 113 directly or after being reflected by the first electrode 111, which is a reflective electrode.

In the present exemplary embodiment, the display unit 100 is not limited to a top emission-type. For example, the display unit 100 is a bottom emission-type display unit 100 in which light is emitted from the organic emission layer to the substrate 101. In this case, the first electrode 111 may be a transparent or translucent electrode, and the second electrode 113 may be a reflective electrode. Alternatively, the display unit 100 may be a double-sided emission-type display unit configured to emit light through top and bottom sides thereof.

A pixel-defining layer 119 is formed of an insulating material on the first electrode 111. The pixel-defining layer 119 may be formed by a spin coating method using at least one organic insulating material selected from polyimide, polyamide, acrylic resins, benzocyclobutene, and phenol resin. The pixel-defining layer 119 exposes a region of the first electrode 111, and the intermediate layer 112 including the organic emission layer is disposed in the exposed region of the first electrode 111. For example, the pixel-defining layer 119 defines pixel regions of the OLEDs.

The organic emission layer of the intermediate layer 112 may include a low molecular weight organic material or a high molecular weight organic material. In addition to the organic emission layer, the intermediate layer 112 may further include functional layers such as a hole transport layer (HTL), a hole injection layer (HIL), an electron transport layer (ETL), or an electron injection layer (EIL).

The voltage line 200, surrounding the display region DA, and the dividing region V, dividing the planarization layer 109 into the central part 109a and the outer part 109b, may be disposed in the non-display region NDA. The voltage line 200 may be partially exposed in the dividing region V, and the planarization layer 109 may cover at least lateral sides of the voltage line 200 exposed in the dividing region V.

The voltage line 200 may include the same material as that used to form the source electrode 107 and the drain electrode 108. For example, the voltage line 200 has a stacked structure including a first layer 200a formed of titanium (Ti), a second layer 200b formed of aluminum (Al), and a third layer 200c formed of titanium (Ti). Since aluminum (Al) is easily etched compared to titanium (Ti), if the lateral sides of the voltage line 200 are exposed in the dividing region V, the first and third layers 200a and 200c (titanium (Ti) layers) formed on the second layer 200b (an aluminum (Al) layer) may be damaged during an etching process because the etching rate of the second layer 200b is relatively high. Thus, the step coverage of the voltage line 200 may deteriorate. As a result, the thin film encapsulating layer 300 formed above the voltage line 200 may have defects. Therefore, the planarization layer 109 covers at least the lateral sides of the voltage line 200 exposed in the dividing region V so as to prevent the formation of defects in the thin film encapsulating layer 300.

The voltage line 200 may include a first voltage line 210 and a second voltage line 220. For example, the first voltage line 210 is a driving voltage (ELVDD) line, and the second voltage line 220 is a common voltage (ELVSS) line. The second voltage line 220 may be connected to the second electrode 113. In FIG. 2, the second voltage line 220 is connected to the second electrode 113 through a line 116. However, the described technology is not limited thereto. For example, the second voltage line 220 and the second electrode 113 are directly connected to each other.

The first voltage line 210 may be disposed at a position corresponding to a side of the display region DA. For example, if the display region DA has a rectangular shape, the first voltage line 210 is disposed at a position corresponding to a side of the display region DA. The first voltage line 210 may be parallel with the side of the display region DA and longer than the side of the display region DA. The side of the display region DA corresponding to the first voltage line 210 may be a side adjacent to the pad unit 150.

A pair of first connection parts (or connectors) 214 may protrude from the first voltage line 210 in a first direction across the dividing region V. The first direction is a direction defined from the display region DA toward the pad unit 150. The pair of first connection parts 214 may be connected to the pad unit 150. The first voltage line 210 may be covered with the central part 109a, and the pair of first connection parts 214 may be exposed in the dividing region V.

At least lateral sides of the pair of first connection parts 214 exposed in the dividing region V may be covered with the planarization layer 109. For example, the lateral sides of the pair of first connection parts 214 are covered with first covering parts 110a extending from the central part 109a and second covering parts 110b extending from the outer part 109b. Since the dividing region V is formed to prevent the permeation of moisture into the display region DA through the planarization layer 109, the first covering parts 110a are formed separate from the second covering parts 110b.

For example, each of the first connection parts 214 includes a first region P1 extending from the first voltage line 210 in the first direction and a second region P2 continuously extending from the first region P1 in the first direction. In addition, the second region P2 may be shifted from the first region P1 in a direction substantially perpendicular to the first direction. In this state, lateral sides of the first region P1 are covered with the first covering parts 110a extending from the central part 109a in the first direction covers, and lateral sides of the second region P2 are covered with the second covering parts 110b extending from the outer part 109b in a direction opposite the first direction, such that the first covering parts 110a may be separate from the second covering parts 110b.

The second voltage line 220 may cover a pair of first end portions 212 of the first voltage line 210 and remaining regions of the display region DA, and the central part 109a may be in contact with inner edge portions of the second voltage line 220 in an overlapping manner, such that inner sides of the second voltage line 220 may be covered.

The second voltage line 220 may include a pair of bent parts 222 covering outer sides of the pair of first end portions 212, and a pair of second connection parts 224 respectively protruding from the pair of bent parts 222 in the first direction across the dividing region V. The pair of second connection parts 224 may be connected to the pad unit 150.

The pair of second connection parts 224 may be exposed in the dividing region V, and lateral sides of the pair of second connection parts 224 may be covered with the second covering parts 110b. In addition, lateral sides 222E formed on end portions of the pair of bent parts 222 in the first direction may be covered with the first covering parts 110a. In this case, the pair of second connection parts 224 may be respectively separate from the end portions of the pair of bent parts 222, and thus the first covering parts 110a may be separate from the second covering parts 110b.

A dam 109c may be formed in the dividing region V. The dam 109c is in contact with outer edge portions of the second voltage line 220 in an overlapping manner such that outer sides of the second voltage line 220 may be covered with the dam 109c. When organic layers 310 and 330 of the thin film encapsulating layer 300 are formed to seal the display unit 100, the dam 109c blocks flows of organic matter toward edges of the substrate 101, thereby preventing the formation of edge tails of the organic layers 310 and 330.

The dam 109c may be formed in the same layer as the planarization layer 109 by using the same material used to form the planarization layer 109. However, the dam 109c is not limited thereto. For example, the dam 109c has two or more layers. For example, if the dam 109c has a double-layer structure, a lower layer includes the same material as that used to form the planarization layer 109, and an upper layer includes the same material as that used to form the pixel-defining layer 119. A plurality of dams 109c may be formed. In this case, the height of the dams 109c may increase in a direction toward the substrate 101.

The thin film encapsulating layer 300 may seal the display unit 100 to prevent the permeation of moisture or oxygen into the display unit 100. The thin film encapsulating layer 300 may include one or more organic layers such as the organic layers 310 and 330, and one or more inorganic layers 320 and 340. In the example shown FIG. 2, the thin film encapsulating layer 300 includes two organic layers 310 and 330 and two inorganic layers 320 and 340 that are alternately stacked. However, the thin film encapsulating layer 300 is not limited thereto. For example, the thin film encapsulating layer 300 further includes inorganic encapsulating layers and organic encapsulating layers that are alternately stacked, and the number of inorganic encapsulating layers and the number of organic encapsulating layers are not limited.

For example, the organic layers 310 and 330 are formed of at least one of an acrylic resin, a methacrylic resin, polyisoprene, a vinyl resin, an epoxy resin, a urethane resin, a cellulose resin, and a perylene resin.

When the organic layers 310 and 330 are formed, the dam 109c blocks flows of organic matter toward edges of the substrate 101. That is, the organic layers 310 and 330 are formed inside the dam 109c.

The inorganic layers 320 and 340 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The inorganic layers 320 and 340 may be larger than the organic layers 310 and 330 and may cover the outer part 109b. Therefore, the dividing region V may be covered with the inorganic layers 320 and 340. In this case, as described above, at least the lateral sides of the voltage line 200 exposed in the dividing region V are covered with the planarization layer 109, thereby improving the step coverage of the voltage line 200 and preventing defects of the inorganic layers 320 and 340 formed above the voltage line 200. In this manner, the permeation of moisture or oxygen into the display elements 100b may be prevented, and defects such as dark points may be minimized.

The inorganic layers 320 and 340 may extend to a region outside the outer part 109b and may be in contact with each other in the region outside the outer part 109b. In addition, at least one of the inorganic layers 320 and 340 may be in contact with the gate insulating layer 104 or the interlayer insulating layer 106 in the region outside the outer part 109b. Therefore, the permeation of moisture through lateral sides may be prevented, and the adhesion of the thin film encapsulating layer 300 may be improved.

Furthermore, in the region outside the outer part 109b, at least one of the inorganic layers 320 and 340 may pass by an end portion of the interlayer insulating layer 106. Then, the at least one of the inorganic layers 320 and 340 may make contact with an upper surface of the substrate 101, and the gate insulating layer 104 and the interlayer insulating layer 106 as well. In this case, edge portions of the inorganic layers 320 and 340 may not be stripped, and thus the sealing characteristics of the thin film encapsulating layer 300 may not be deteriorated or disabled.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one the inventive technology been described with reference to the figures, it will be understood by those of ordinary skill in the art that various changes in form and details may be made therein without departing from the spirit and scope as defined by the following claims.

What is claimed is:

1. A display device, comprising:
    a substrate; and
    a display unit disposed on the substrate and including a plurality of pixels each pixel comprising a thin film transistor, a display element electrically connected to the thin film transistor, and a planarization layer interposed between the thin film transistor and the display element,
    wherein the display unit comprises a display region and a non-display region surrounding the display region, wherein the non-display region includes a voltage line,
    wherein the planarization layer comprises a central portion, an outer portion and a dividing region interposed between the central and outer portions, wherein the dividing region is located in the non-display region,
    wherein the planarization layer covers at least a lateral side of the voltage line formed in the dividing region, and
    wherein the voltage line comprises i) a first voltage line disposed at a position corresponding to a side of the display region and ii) a pair of first connectors protruding from the first voltage line in a first direction, the first connectors comprising:
        a first region extending from the first voltage line in the first direction; and
        a second region continuously extending from the first region in the first direction,
        wherein the second region is shifted from the first region in a second direction crossing the first direction,
        wherein lateral sides of the first connectors are covered by a pair of first covering portions extending from the central portion and a pair of second covering portions extending from the outer portion, and
        wherein the first and second covering portions are separated apart from each other.

2. The display device of claim 1, wherein the first covering portions extend from the central portion in the first direction and cover lateral sides of the first regions, and
    wherein the second covering portions extend from the outer portion in a third direction opposite the first direction and cover lateral sides of the second regions.

3. The display device of claim 1, wherein the voltage line further comprises a second voltage line covering a pair of first end portions of the first voltage line and a remaining region of the display region other than the side of the display region, and
    wherein the central portion contacts and overlaps an inner edge portion of the second voltage line in the depth dimension of the display device.

4. The display device of claim 3, wherein the second voltage line comprises:
    a pair of bent portions covering the first end portions; and
    a pair of second connectors respectively protruding from the bent portions in the first direction,
    wherein the second covering portions cover lateral sides of the second connectors.

5. The display device of claim 4, wherein the second connectors are respectively spaced apart from end portions of the bent portions, and
    wherein the first covering portions cover lateral sides formed on the end portions of the bent portions.

6. The display device of claim 3, further comprising a dam contacting and overlapping outer edge portions of the second voltage line in the depth dimension of the display device, wherein the dam is located in the dividing region and spaced apart from the central portion.

7. The display device of claim 6, wherein the dam is formed on the same layer as the planarization layer and formed of the same material as that of the planarization layer.

8. The display device of claim 6, further comprising a thin film encapsulating layer sealing the display unit, wherein the thin film encapsulating layer comprises at least one organic layer and at least one inorganic layer, and wherein the at least one organic layer is located inside the dam.

9. The display device of claim 8, wherein the at least one inorganic layer extends to a region outside the outer portion.

10. The display device of claim 9, wherein the thin film transistor comprises an active layer, a gate electrode, a source electrode, and a drain electrode, and
  wherein each of the source electrode, the drain electrode, and the voltage line has a triple-layer structure formed of titanium, aluminum, and titanium.

11. The display device of claim 1, further comprising:
  a gate insulating layer interposed between the active layer and the gate electrode; and
  an interlayer insulating layer interposed between the gate and source electrodes and between the gate and drain electrodes,
  wherein the gate insulating layer and the interlayer insulating layer extend into the non-display region, and
  wherein the at least one inorganic layer contacts the gate insulating layer or the interlayer insulating layer in the region outside the outer portion.

12. The display device of claim 11, wherein the at least one inorganic layer is formed over an end portion of the gate insulating layer or the interlayer insulating layer and contacts an upper surface of the substrate.

13. The display device of claim 1, wherein the display element includes an organic light-emitting diode comprising a first electrode electrically connected to the thin film transistor, a second electrode opposite the first electrode, and an intermediate layer interposed between the first and second electrodes.

* * * * *